United States Patent [19]

Ledzius et al.

[11] Patent Number: 5,057,840
[45] Date of Patent: Oct. 15, 1991

[54] Σ-Δ MODULATOR FOR DIGITAL-TO-ANALOG CONVERTER

[75] Inventors: Robert C. Ledzius, Austin; James S. Irwin, Paige, both of Tex.

[73] Assignee: Motorola, Inc., Schaumburg, Ill.

[21] Appl. No.: 633,829

[22] Filed: Dec. 26, 1990

[51] Int. Cl.$^5$ ............... H03M 1/66; H03M 1/78; H03M 1/06
[52] U.S. Cl. ................... 341/144; 341/118; 341/154; 341/143
[58] Field of Search ............ 341/144, 146, 154, 118, 341/143, 145

[56] References Cited

U.S. PATENT DOCUMENTS

| | | | |
|---|---|---|---|
| 3,893,102 | 7/1975 | Candy | 341/145 |
| 4,006,475 | 2/1977 | Candy et al. | 341/145 |
| 4,270,027 | 5/1981 | Agrawal et al. | 379/339 |
| 4,528,551 | 7/1985 | Agrawal et al. | 341/143 |
| 4,789,862 | 12/1988 | Jackson | 341/144 X |
| 4,857,928 | 8/1989 | Gailus et al. | 341/143 |
| 4,901,077 | 2/1990 | Christopher | 341/143 |

OTHER PUBLICATIONS

Vanderkooy et al., "Resolution Below the Least Significant Bit in Digital Systems with Dither", J. Audio Eng. Soc., vol. 32, No. 3, Mar. 1984.
Finck, R., "High Performance Stereo Bit Stream DAC with Digital Filter", IEEE Transactions on Consumer Electronics, vol. 35, No. 4, Nov. 1989.
Leslie et al., "An Improved Sigma-Delta Modulator Architecture", Plessey Research Caswell Ltd., Caswell Towcester, Northants NN12 8EQ, Eng.

Primary Examiner—A. D. Pellinen
Assistant Examiner—Sharon D. Logan
Attorney, Agent, or Firm—Paul J. Polansky

[57] ABSTRACT

A digital signal having a plurality of bits is received by a converter. Two of the bits, the most significant bit and a second bit which is not the most significant bit or the second most significant bit, are tapped from the output and used as a feedback signal. These two bits are also used to form an analog output signal. The two bits are attenuated using a weighted network and then summed to provide the analog output signal.

11 Claims, 2 Drawing Sheets

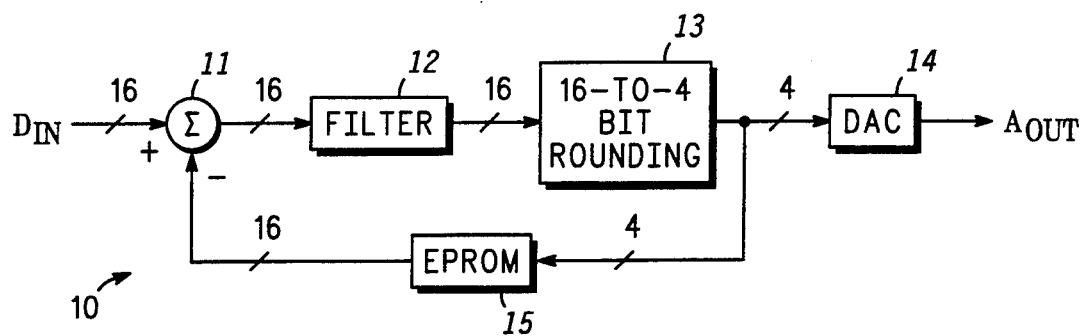
FIG. 1
-PRIOR ART-
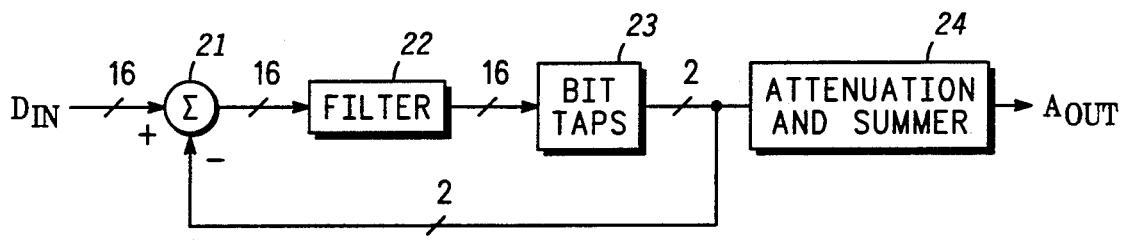
FIG. 2
FIG. 4
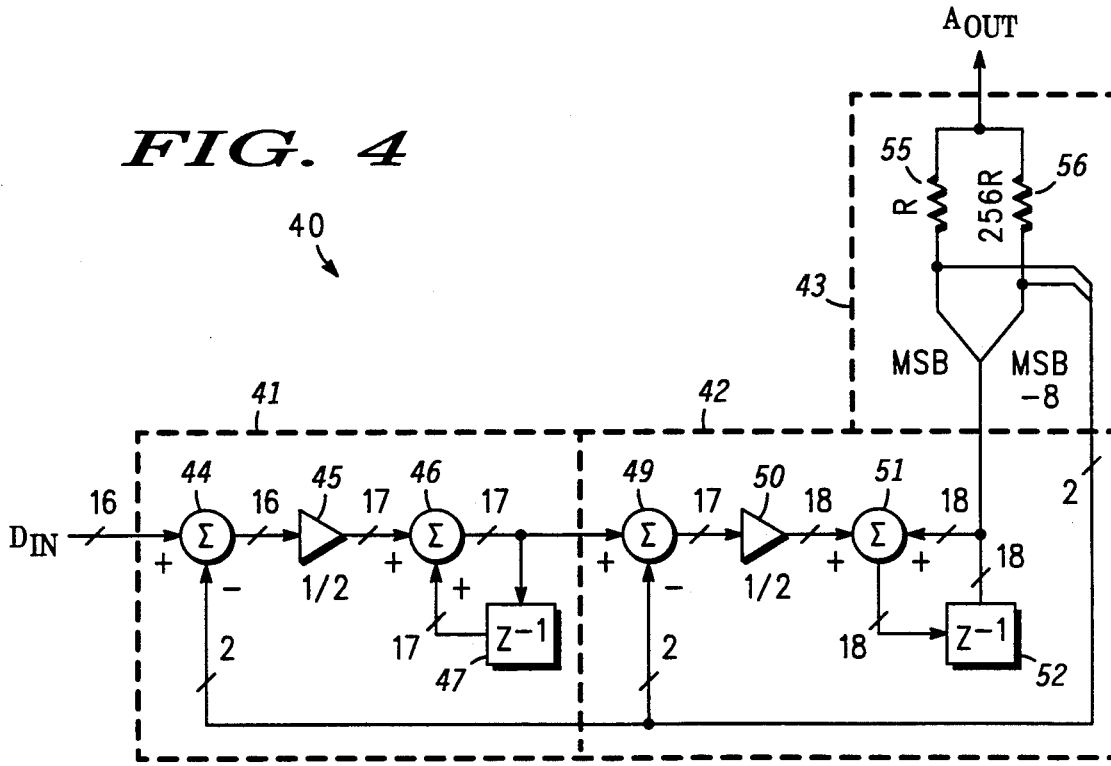

INPUT = 75/256

Σ-Δ MODULATOR FOR DIGITAL-TO-ANALOG CONVERTER

FIELD OF THE INVENTION

The present invention relates, in general, to delta-sigma modulators and, more particularly, to delta-sigma modulators for digital-to-analog converters.

BACKGROUND OF THE INVENTION

There are two basic techniques used in digital-to-analog converters (DACs). These are the sigma-delta (Σ-Δ) such as used herein and the resistive or capacitive divider techniques.

The Σ-Δ technique is attractive because it achieves high resolution by precise timing instead of precisely matched on-chip components (resistors). In addition, the expertise needed to produce thin film, laser trimmed analog components is difficult to obtain; whereas, high speed digital switching capability is commonplace in the semiconductor industry.

A basic Σ-Δ DAC receives a digital signal which is summed with the inverse feedback of the analog output signal (after being reconverted to a digital signal) to provide an error signal. The error signal is then processed through an integrator and a comparator to provide the analog output signal. The analog signal is also processed through an analog-to-digital converter (ADC) to provide the feedback signal.

SUMMARY OF THE INVENTION

A digital signal having a plurality of bits is received by the converter. A feedback signal is then subtracted from the received signal forming a digital error signal. The digital error signal is filtered and each bit of the filtered digital error signal is then used to generate an output energy signal. The most significant bit of the filtered digital error signal and a bit other than the most significant or second most significant bits are then used as the feedback signal and are converted to analog signals, summed, and provided as the output of the converter.

BRIEF DESCRIPTION OF THE DRAWINGS

FIG. 1 is a block diagram of a prior art Σ-Δ DAC;

FIG. 2 is a block diagram of a Σ-Δ DAC embodying the present invention;

FIG. 4 is a block diagram of a second order Σ-Δ DAC embodying the present invention.

DETAILED DESCRIPTION OF THE DRAWINGS

Figure 3:
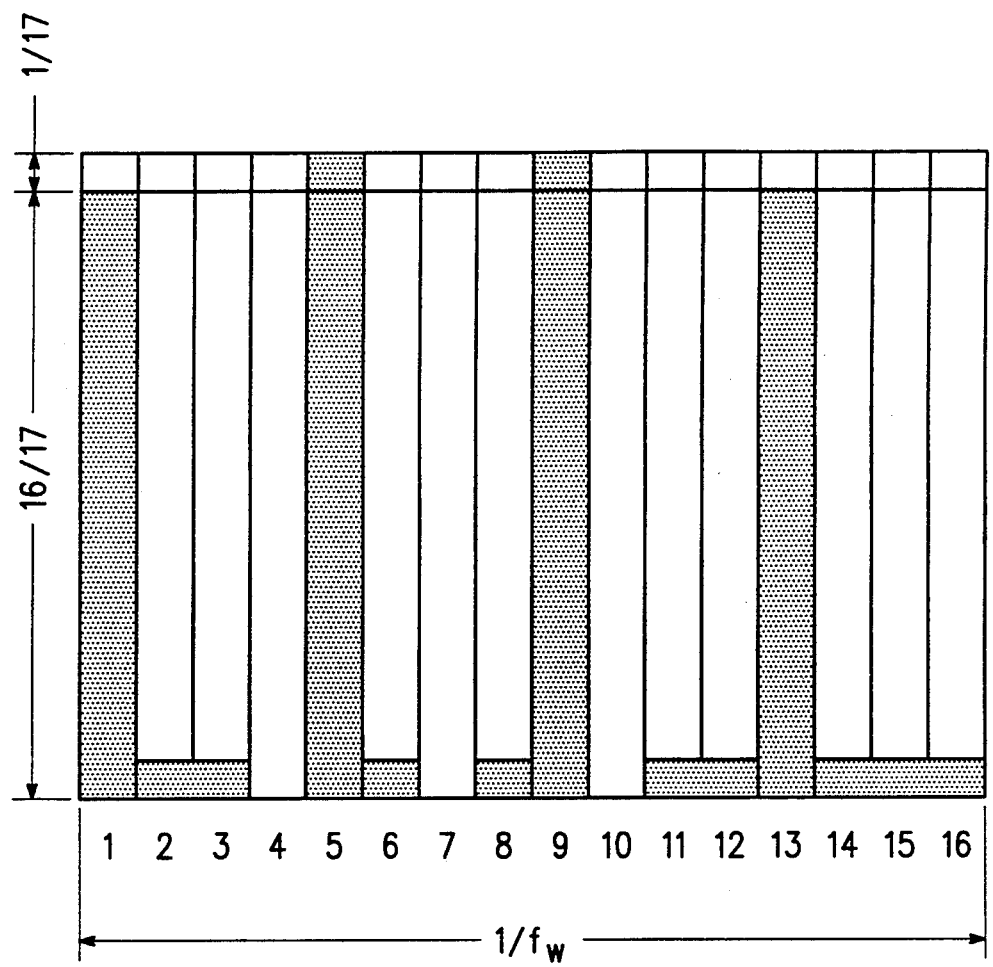
FIG. 3 is a time domain graphical representation of a DC word as converted using the Σ-Δ DAC of FIG. 2.

Referring initially to FIG. 1, a prior art Σ-Δ DAC, generally designated 10, is illustrated. Converter 10 consists essentially of a summing device 11, a filter 12, a 16-to-4 rounding device 13, a DAC 14, and an EPROM (Electrical Programmable Read Only Memory) 15.

In operation, a 16-bit digital input signal is received by one input of summing device 11. This signal is then summed with a 16-bit feedback error signal from EPROM 15. The resulting 16-bit signal is processed through filter 12 and input to rounding device 13. Rounding device 13 converts the 16-bit word to a 4-bit word which is transmitted to DAC 14 and EPROM 15. DAC 14 provides the analog output of modulator 10.

EPROM 15 can be programmed to compensate for the non-linearities in DAC 14.

Referring now to the block diagram of FIG. 2, a Σ-Δ DAC, generally designated 20, embodying the present invention is illustrated. Converter 20 consists of a summing device 21, a filter 22, bit taps 23, and attenuation and summing device 24.

In operation, a 16-bit digital input signal is received by one input of summing device 21. This 16-bit input is summed with a 2-bit feedback signal. The two bits in the feedback signal are the most significant bit and a second bit. The second bit is preferably a bit between the least significant bit and the third most significant bit, inclusive. The output of summing device 21 is filtered in filter 22 and provided to bit taps 23.

In bit taps 23, the most significant bit and the second bit are forwarded to attenuation and summing device 24 which provides the analog output signal. The two bits from bit taps 23 are also provided as the feedback signal to summing device 21.

In the above approach, the two bits tapped are used as coarse and trim output bits. This method allows the total voltage energy at the word rate to sufficiently resolve the input voltage to the desired resolution. The trim bit stream represents only small amplitude signals and leaves the large values to be resolved in the original output which is now a coarse output.

Since no small signals have to be represented in the coarse output, no long term patterns are required thereby avoiding in-band frequency components in the coarse bit stream. In the trim bit stream, in-band frequency components do not occur because of the limited resolution range required. The full amplitude trim pulses are then attenuated by a corresponding amount so that the sum of the two bit streams is the correct magnitude and fully represents the digital input signal.

In FIG. 3, a time domain graphical representation of an 8-bit DC word as converted using the present invention is illustrated. The vertical axis of the graph represents the amplitude of a signal and the horizontal axis represents the clock cycles. The amplitudes shown in FIG. 3 illustrate the two-bit feedback signals utilized in FIG. 2 where the coarse bit is 16/17 and the trim bit is 1/17. If both bits were to be received during the same clock pulse, then a full 17/17 amplitude is represented. Whereas, if neither bit is received, a 0/17 amplitude is represented.

In the particular example of FIG. 3, in the first cycle a coarse correction bit is received. This is followed by two trim bits in the second and third clock cycles. In the fourth clock cycle, neither bit is received; and in the fifth clock cycle, both bits are received. This continues through the sixteen clock cycles as shown. Adding the total amplitudes throughout the sixteen clock cycles shows an amplitude of 75/256.

Referring now to FIG. 4, a block diagram of a second order Σ-Δ DAC modulator, generally designated 40, is illustrated. Modulator 40 consists generally of a first stage 41, a second stage 42, bit-taps and an attenuation and summing device 43. Stage 41 comprises a first summing device 44 which sums the 16-bit input digital signal ($D_{IN}$) with the inverse of a 2-bit feedback signal from device 43. The output from summing device 44 is then processed through amplifier 45 where the amplitude is reduced by one-half. The signal from amplifier 45 is then summed with a delayed feedback signal in summing device 46. The output of summing device 46 is delayed in delay 47 before being input to the second input of summing device 46. The output of summing device 46 is also output from first stage 41 to second stage 42.

In stage 42 a summing device 49 receives the 17-bit input from stage 41. This input is then added to the inverse of the 2-bit feedback signal from device 43. The resulting signal is processed through amplifier 50, where the amplitude is reduced by one-half, and transmitted to a first input of a summing device 51. A delayed feedback of the output of summing device 51 is input to the second input of device 51. The resulting signal is processed through a delay 52 before being returned to summing device 51 and being forwarded to device 43.

In device 43 the 18-bit output signal from stage 42 is received. Two of the 18 bits are then selected to provide the 2-bit feedback signal and the analog output signal. Preferably, one of the two bits selected is the most significant bit (MSB) and the other is a bit between the third most significant bit and the least significant bit, inclusive. In the present example, the MSB and the ninth most significant bit (MSB-8) have been selected. These bits are tapped and input to the feedback inputs of summing devices 44 and 49.

The signals on these bit lines are also attenuated through resistors 55 and 56 before being summed together at a node 57 to provide the analog output ($A_{OUT}$) signal. As shown, resistor 55 is a reference resistor having value R and resister 56 has a value of 256R. These values are selected because the bits have the same amplitudes when output from stage 42. Therefore, the selected bits must be weighted properly to provide an accurate output analog value. In this example, the second bit is the ninth most significant bit located 8 bits down from the most significant bit and, since $2^8$ is 256, must have the amplitude reduced accordingly. Although a resistor attenuation and summing network is shown, the network can be implemented using weighted switched capacitors which could be incorporated directly into a switched capacitor smoothing filter if desired.

With an over sampling ratio of 256 ($2^8$), only eight bits of resolution can be assured for the most significant output for the desired bandwidth. Therefore, the second tap is taken eight bits down from the most significant bit to insure smaller increments of energy can be represented in a data word cycle. The trim bit is able to represent energies accurately for an additional 8 bits of resolution yielding a final resolution of 16 bits, insuring that the noise shaping of the modulator is as expected for all allowable input signals.

The component matching accuracy of only eight bits is more than sufficient to insure the trim tap does not distort large signals, primarily represented by the coarse tap; and that the coarse tap does not distort small signals, primarily represented by the trim tap.

It should be noted that this invention is not limited to the use of two taps. An 18-bit Σ-Δ DAC can be realized with a 64 ($2^6$) over sampling ratio using three taps spaced six bits apart (bits 19, 13, and 7). Bit 7 would be attenuated 72 dB and bit 13 by 36 dB within the summing network. Component matching requirements would be no worse than 12 bits of accuracy.

Thus, it will be apparent to one skilled in the art, upon reviewing the foregoing description, that there has been provided in accordance with the invention, a process and method that fully satisfy the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A method for converting a digital signal to an analog signal in a digital-to-analog converter comprising the steps of:

receiving a digital signal at an input of said digital-to-analog converter, said digital signal having at least three bits;

subtracting a feedback signal from said digital signal forming a digital error signal having at least three bits including a most significant bit and a second most significant bit;

generating a plurality of output energy signals, each of said plurality of output energy signals representing one of said at least three bits of said digital error signal;

forming a digital output representation of said digital error signal using said most significant bit of said at least three bits and a second bit of said at least three bits wherein said second bit is not said most significant bit or said second most significant bit, said most significant and second bits of said digital output representation forming said feedback signal; and forming an analog signal of said digital output representation.

2. The method of claim 1 wherein said step of forming a digital output representation also includes using a third bit, said third bit not being said most significant bit, said second most significant bit, or said second bit.

3. The method of claim 1 wherein said step of forming an analog signal comprises the steps of:

forming an individual analog signal of each of said bits of said digital output representation to represent a significance of each of said bits; and summing said individual analog signals to form said analog signal output of said digital-to-analog converter.

4. A method for converting a digital signal to an analog signal in a digital-to-analog converter comprising the steps of:

receiving a digital signal having at least three bits at a first input of a summing device and a feedback signal at a second input of said summing device;

summing said digital signal with an inverse of said feedback signal to form a digital error signal having at least three bits including a most significant bit and a second most significant bit;

tapping off a most significant bit and a second bit to form said feedback signal, wherein said second bit is not said most significant bit or said second most significant bit;

attenuating said most significant bit and said second bit, thereby forming a most significant energy signal and a second energy signal; and summing said most significant energy signal and said second energy signal to form said analog signal.

5. The method of claim 4 wherein in said step of attenuating, said most significant energy signal and said second energy signal are weighted to represent a significance of each of said energy signals.

6. A method for converting a digital signal to an analog signal in an digital-to-analog converter comprising the steps of:

receiving a digital signal having at least three bits at a first input of a first summing device and a first feedback signal at a second input of said first summing device;

summing said digital signal with an inverse of said feedback signal to form a first digital error signal having a plurality of bits;

reducing an amplitude of each of said plurality of bits of said first digital error signal forming a first reduced digital signal;

summing said first reduced digital signal with a second feedback signal in a second summing device forming a second digital error signal having a plurality of bits;

summing said second digital error signal with an inverse of said first feedback signal in a third summing device, forming a third digital error signal having a plurality of bits;

reducing an amplitude of each of said plurality of bits of said third digital error signal forming a second reduced digital signal;

summing said second reduced digital signal with a third feedback signal in a fourth summing device forming a fourth digital error signal having at least three bits including a most significant bit and a second most significant bit;

tapping off a most significant bit and a second bit of said fourth digital error signal to form said first feedback signal, wherein said second bit is not said most significant bit or said second most significant bit;

attenuating said most significant bit and said second bit of said fourth digital error signal, forming a most significant energy signal and a second energy signal; and summing said most significant energy signal and said second energy signal to form said analog signal.

7. The method of claim 6 wherein in said step of attenuating, said most significant bit and said second bit of said fourth digital error signal are weighted to represent a significance of each of said bits.

8. The method of claim 6 wherein said second feedback signal is said second digital error signal.

9. The method of claim 8 wherein said second feedback signal is delayed in a first delay device before being summed with said first reduced digital signal.

10. The method of claim 6 wherein said third feedback signal is said fourth digital error signal.

11. The method of claim 10 wherein said third feedback signal is delayed in a second delay device before being summed with said second reduced digital signal.

* * * * *